(12) United States Patent
Karlquist

(10) Patent No.: US 6,823,466 B2
(45) Date of Patent: Nov. 23, 2004

(54) CIRCUIT AND METHOD FOR ADJUSTING THE CLOCK SKEW IN A COMMUNICATIONS SYSTEM

(75) Inventor: Richard K. Karlquist, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 621 days.

(21) Appl. No.: 09/967,443

(22) Filed: Sep. 28, 2001

(65) Prior Publication Data

US 2003/0065988 A1 Apr. 3, 2003

(51) Int. Cl.[7] .............................................. G11B 5/00
(52) U.S. Cl. ..................... 713/500; 713/503; 713/400
(58) Field of Search .................................. 713/400, 401, 713/500, 501, 502, 503, 600, 601

(56) References Cited

U.S. PATENT DOCUMENTS 4,546,269 A * 10/1985 Johnson ...................... 713/503
5,608,343 A * 3/1997 Ojima et al. .................. 326/93
6,687,844 B1 * 2/2004 Zhang ......................... 713/503
2003/0065988 A1 * 4/2003 Karlquist ..................... 714/700

FOREIGN PATENT DOCUMENTS

| EP | 001298443 A2 * | 4/2003 | ......... G01R/31/319 |
| JP | 2003-198521 * | 7/2003 | ............. G06F/1/10 |

* cited by examiner

Primary Examiner—Fritz M. Fleming

(57) ABSTRACT

A circuit and method are disclosed for adjusting the clock skew in a synchronous system. The circuit and method include initially applying an offset voltage to a data input of a device in the system. Next, the clock skew between a device and a data source providing data thereto is adjusted to approximately 180 degrees, by selecting the clock skew resulting in an approximately maximum DC offset appearing at the output of the device. Thereafter, the clock skew is shifted from approximately 180 degrees to the desired clock skew amount.

43 Claims, 4 Drawing Sheets

CIRCUIT AND METHOD FOR ADJUSTING THE CLOCK SKEW IN A COMMUNICATIONS SYSTEM

BACKGROUND OF THE INVENTION

1. Technical Field of the Invention

The present invention relates to adjusting the timing within a communications system, and particularly to adjusting the clock timing between devices within the communications system.

2. Description of Related Art

Traditionally, synchronously clocked logic systems utilize a timing methodology requiring all logic elements to be clocked simultaneously, or at least with tolerable clock skew. This methodology is suitable for computers in which the entire central processing unit is disposed in a single integrated circuit so that delays can be well controlled. However, this methodology proves ineffective in the case of digital communications systems operating at higher speeds, such as ethernet and fiber optic data links. In these systems, data often flows through various data processing components in a somewhat asynchronous fashion. Typical data communication components in these systems include multiplexers/demultiplexers (also known as serializers/deserializers), error correction processors, and protocol/format converters. In some digital communications systems, there are many clocks having various phases relative to each other, and in many cases the clocks operate at different integer multiples of a clock frequency.

In addition, delays in digital communications systems are oftentimes longer than delays in traditional designs. For instance, delays in some digital communications systems are multiple clock periods in length. The delays in digital communications systems are oftentimes longer than delays in traditional designs because some data processing tasks require more than one clock period to execute. In addition, the delays are oftentimes longer than delays in traditional designs because the physical length of transmission lines connecting system components together are longer than transmission lines utilized in traditional designs. As can be understood, the longer delays can complicate data transfer between components in a system.

Further complicating data transfer between system components in digital communications systems is the fact that many system components generate internal clocks that are phase locked to an externally available clock and have indeterminate phase shifts, relative to the externally available clock. There is often no particular timing relationship between the time when the input data to a system component is sampled, when the output data of the component transitions, and the occurrence of the triggering edge of the internal clock(s). As a result, a need exists for adjusting the timing within systems, such as digital communications systems, so that data is sampled by the system components at the appropriate time.

Efforts to better control the timing between components in a system have met with limited success. Some systems and test equipment apply a repetitive test pattern to a system component while the output of the system component is observed with a high-speed sampling oscilloscope. During this time, the phase of the clock input to the system component can be manually adjusted until the system component under test produces the correct output data, based on the data going into the component. The oscilloscope is capable of effectively sampling at many different clock phases so that usually there is no problem synchronizing the oscilloscope to the output data. However, there are two serious limitations to employment of an oscilloscope in this manner. First, the oscilloscope limits the maximum data rate of the system to be the maximum speed observable on the fastest available oscilloscope. Second, in a system to be used outside the laboratory, it is not economically feasible to build an expensive oscilloscope into the system for the purpose of adjusting clock skew in the field.

A prior attempt to work around the shortcomings of the above-described oscilloscope-based system involves measuring the bit error rate (BER) of the data output generated by the system component under test as the clock skew is varied, and choosing the clock skew having the lowest BER. However, this approach is problematical because there are usually a number of cascaded system components involved in a BER test, all of which have to have the correct clock skew in order to obtain correct data at the output of the chain of cascaded components. This approach of measuring the BER of a system, therefore, requires a multi-dimensional search to arrive at a usable set of clock skews. In addition, the relationship between BER and clock skew is such that identifying a minimum BER is often difficult.

Based upon the foregoing, there is a need for a simple and accurate method for adjusting clock skew or other timing within a communications system.

SUMMARY OF THE INVENTION

Embodiments of the present invention overcome shortcomings in prior techniques for adjusting timing and satisfy a significant need for a method and device for relatively quickly and accurately adjusting clock signals for devices in a system. Clock skew and/or phase between the clock input to a device under test and a clock input to a data source is first adjusted to approximately 180 degrees. Thereafter, the 180 degree clock skew is shifted by approximately 180 degrees to obtain near zero clock skew. In particular, the clock skew is adjusted to approximately 180 degrees by applying an input data pattern to the device under test having a predetermined DC offset voltage, and measuring a DC offset voltage of the output of the device under test at a plurality of different clock skew amounts. The clock skew that produces the largest magnitude of DC offset at the data output of the device under test is the clock skew of 180 degrees.

Exemplary circuitry for effectuating the clock skew adjusting and shifting includes phase shifter circuitry connected to a clock input of one of the device under test and the data source, and a voltage measuring circuit connected to the output of the device under test.

Furthermore, the invention provides embodiments with other features and advantages in addition to or in lieu of those discussed above. Many of these features and advantages are apparent from the description below with reference to the following drawings.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION OF THE EXEMPLARY EMBODIMENTS OF THE PRESENT INVENTION

Figure 1:
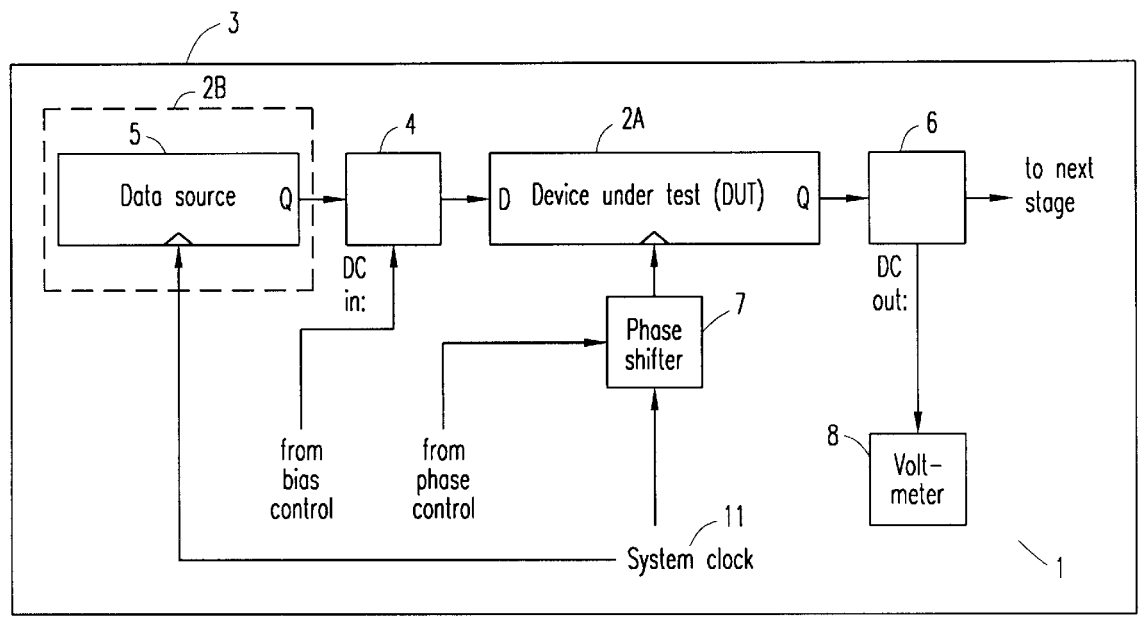
FIG. 1 is a block diagram of a portion of a communications system according to an exemplary embodiment of the present invention.

Referring to FIG. 1, there is shown a circuit 1 for adjusting clock skew between devices 2A and 2B in a system 3, such as a communications system, according to an exemplary embodiment of the present invention. Circuit 1 allows clock inputs to devices 2A and 2B of system 3 to be precisely set relative to each other so that the clock skew between the clock inputs to devices 2A and 2B are optimized.

It is understood that devices 2A and 2B may be function blocks or other components within a synchronous system 3. It is understood that system 3 may be any system in which clock timing is relatively difficult to tightly control. For reasons of simplicity, each device 2A and 2B will be described as having a single clock input, data input and data output. It is understood, however, that devices 2 may each include multiple clock and data inputs and data outputs.

With reference to the portion of system 3 shown in FIG. 1, device 2A under test receives data from device 2B, and particularly from a data source 5 of device 2B. According to an exemplary embodiment of the present invention, circuit 1 includes a bias circuit 4 connected between a data output of a data source 5 and a data input of device 2A. Bias circuit 4, commonly referred to as a level shifter, includes a first input for receiving an input signal, such as a signal having little or no DC offset, a second input for receiving a DC bias, and an output. Bias circuit 4 combines the DC bias appearing at its second input to the signal appearing at the first input to obtain a combined signal, and applies the combined signal to the output of bias circuit 4 In this way, bias circuit 4 is used to vary the DC offset of the data signal applied to the device 2A.

It is understood that device 2B may internally add a DC bias to a digital signal generated by device 2B. In this instance, bias circuit 4 would be unnecessary.

Systems conventionally include a common clock signal, such as a system clock, that is directly connected to the clock input of each system device in the system. According to the exemplary embodiment of the present invention illustrated in FIG. 1, however, circuit 1 includes a phase shift circuit 7 connected between a system clock 11 of system 3 and the clock input of device 2A. Phase shift circuit 7 includes a clock input and a control input. The output signal generated by phase shift circuit 7 is shifted in phase relative to the clock input thereof by an amount based upon the control input. With data source 5 being directly connected to the system clock 11 and device 2A being connected to the system clock 11 via phase shift circuit 7, the clock skew between the input clocks for device 2B and device 2A may be set to the desired amount.

A voltmeter 8 is connected to the output of device 2A via a splitter circuit 6. Voltmeter 8 measures and visually indicates the DC voltage appearing at the output of device 2A. Splitter circuit 6 allows voltmeter 8 to measure the DC level appearing in the output of device 2A.

The operation of the present invention to optimize the clock skew between device 2B and device 2A in system 3 is, in general terms, a two step operation. First, the clock skew between device 2A and device 2B is adjusted to approximately 180 degrees. Second, the 180 degree clock skew is then shifted by approximately 180 degrees so as to set the clock skew between devices 2A and 2B to approximately zero degrees.

The rationale behind the operation is as follows. A DC offset added to the input data pattern applied to device 2A can be used to determine when the clock skew between devices 2A and 2B is 180 degrees. First, suppose data source 5 provides an input data pattern to device 2A having a particular duty cycle, i.e., a particular ratio of logic one data bits to logic zero data bits. If the clock skew between the clock input of device 2A and the clock input of data source 5 is optimized (i.e., at a clock skew such that input data to device 2A is interpreted without error), the output of device 2A will have the same duty cycle as the input data pattern. The DC component of the output of device 2 will therefore correspond to the particular duty cycle of the input data pattern provided to device 2A.

If the clock skew between devices 2A and 2B is at or near zero degrees, a reasonable amount of DC offset added to the input data pattern that is applied to device 2A will not affect the ability of device 2A to correctly interpret the input data pattern. Device 2A will still be able to interpret the input data pattern with sufficient margin. The duty cycle of the output data pattern generated by device 2A will therefore be the same as the duty cycle of the input data pattern applied to device 2A. As a result, a DC offset added to the input data pattern will not change the DC component of the data output pattern. There is thus little or no transfer of DC offset from the input data pattern applied to device 2A to the output data pattern generated thereby at relatively small clock skew amounts.

If the clock skew between devices 2A and 2B is at 180 degrees, device 2A will ideally make random decisions at each triggering edge of the clock input to device 2A. The random decisions are whether to interpret the input data pattern as the outgoing data bits (already maintained by device 2A) or the incoming data bits (appearing at the data input of device 2A). Without any other conditions effecting the timing or signal levels of the data and clock inputs to device 2A, there is an equal probability of a logic zero data bit being interpreted as a logic one data bit as there is a logic one data bit being interpreted as a logic zero data bit. As a result, the duty cycle of the output data pattern generated by device 2A will ideally be the same as the duty cycle of the input data pattern applied to device 2A. From this it can be seen that for a clock skew of 180 degrees between devices 2A and 2B, the DC component of the data pattern appearing at the output of device 2A will closely correspond to the duty cycle of the input data pattern applied to device 2A.

However, if a DC offset is added to the input data pattern applied to device 2A while the clock skew remains at 180 degrees, the decisions made by device 2A will change. The probability of device 2A interpreting a logic zero data bit will no longer be the same as the probability of device 2A interpreting a logic one data bit. For instance, a DC offset added to the input data pattern in the direction of a logic one value will increase the likelihood that device 2A will interpret logic one data bits. Most of the input data bits of the input data pattern that transition will be interpreted as a logic one data bit. This increased likelihood of a logic one data bit interpretation increases the duty cycle of the data output pattern generated by device 2A to approximately 100% and thereby increases the DC component of the data output pattern.

Similarly, a DC offset in the direction of a logic zero value will increase the likelihood that logic zero data bits will be interpreted by device 2A. Most of the input data bits of the input data pattern that transition will be interpreted as a logic zero data bit. The increase in logic zero data bit interpretation decreases the duty cycle of the data output pattern generated by device 2A to approximately 0% and thereby decreases the DC component of the data output pattern generated by device 2A.

From this it can be seen that at a clock skew of 180 degrees, the DC offset in the input data pattern applied to device 2A causes a change in the DC offset in the output data pattern generated by device 2A. In other words, there is a relatively sizeable transfer of DC offset from the input data pattern applied to device 2A to the output data pattern generated thereby when the clock skew between device 2A and data source 5 is at 180 degrees.

For clock skew values close to but not equaling 180 degree, such as clock skews between 160 degrees and 180 degrees, a DC offset added to the input data pattern of device 2A affects the DC offset in the output data pattern of device 2A. However, the effect is less than when the clock skew is at 180 degrees. At clock skew values close to 180 degrees, noise and jitter will cause a statistical distribution of the output data pattern generated by device 2A to change the duty cycle of the output data pattern, relative to the duty cycle of the output data pattern at a 180 degree clock skew. In the event the input data pattern has a DC bias in the direction of a logic one and a 50% duty cycle, the duty cycle of the output data pattern generated by device 2A will be between 50% and 100%. In the event the input data pattern has a DC bias in the direction of a logic zero and a 50% duty cycle, the duty cycle of the output data pattern generated by device 2A will be between 0% and 50%. The resulting DC bias in the output data pattern will therefore be less in magnitude at clock skew amounts close to 180 degrees than the DC bias in the output data pattern at a 180 degree clock skew. At clock skew amounts close to 180 degrees, the transfer of DC offset from the data input to device 2A to the data output thereof is therefore less than the transfer of DC offset at a 180 degree clock skew.

Figure 2:
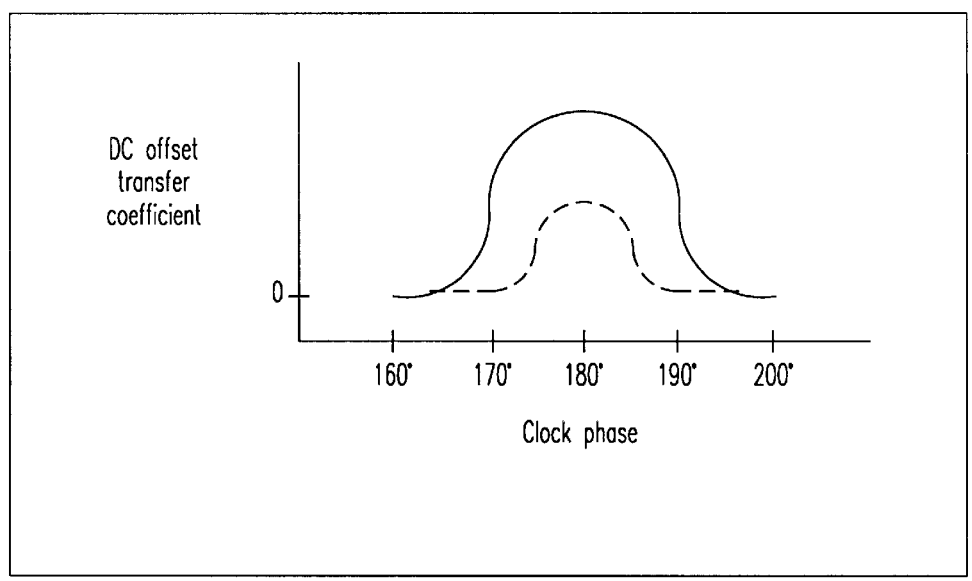
FIG. 2 is a graph of a DC offset transfer curve corresponding to the portion of the communications system of FIG. 1.

A curve illustrating the relationship between clock skew and the transfer of DC offset from the data input of device 2A to the data output thereof is shown in FIG. 2. The curve of FIG. 2 describes the DC offset transfer characteristic of device 2A over a range of clock skew values. It is understood that the shape of the curve of FIG. 2 may depend in part upon the characteristics of the particular hardware in system 3.

The magnitude of the DC offset added to the input data pattern to device 2A affects the shape of the curve of FIG. 2. Specifically, increasing the magnitude of the DC offset of the input data pattern applied to device 2A broadens the curve of FIG. 2, and decreasing the magnitude of the DC offset of the input data pattern narrows the curve. FIG. 2 shows the relationship between clock skew and the transfer of DC offset at a first DC offset value (in solid lines) and a second DC offset value that is of a smaller magnitude relative to the first DC offset value (in dashed lines).

Figure 3:
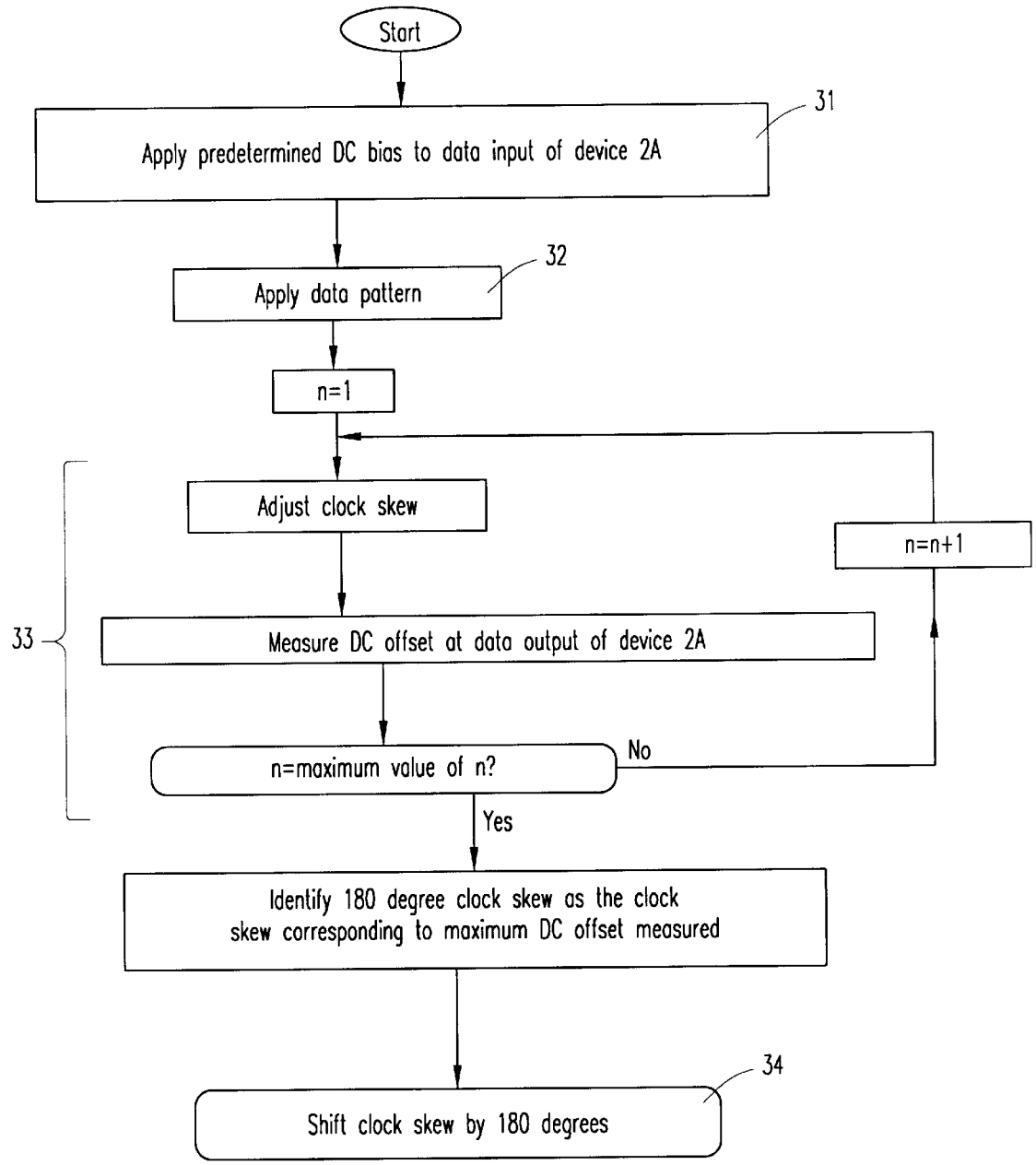
FIG. 3 is a flow chart illustrating an operation of the portion of the communications system of FIG. 1.

Based upon the relationship between clock skew and the transfer of DC offset from the data input of device 2A to the data output thereof, the operation of circuit 1 to optimize clock skew between device 2A and data source 5 will be described with reference to FIG. 3. First, bias circuit 4 is manipulated at 31 so that a predetermined DC offset is added to the data provided to the data input of device 2A. The magnitude of the predetermined DC offset is selected to be large enough so that a measurable DC offset level may be transferred from the data input of device 2A to the data output thereof, and small enough so that transferred DC offset peaks at the 180 clock skew instead of the peak being broadened so as to make the peak relatively indistinguishable.

Next, a data pattern is applied to device 2A at 32. The data pattern may be a repeated data pattern so that data is substantially continuously provided to device 2A during the operation to optimize the clock skew.

The clock skew between data source 5 and device 2A is then adjusted at 33 to approximately 180 degrees. The clock skew adjustment is accomplished by manipulating phase shift circuit 7 to present a clock skew between the clock input of device 2A and the clock input of data source 5 and reading, using voltmeter 8, the DC offset in the data output generated by device 2A. The manipulating and reading is then repeated a number of times with other clock skew amounts. Repeating the manipulating and reading steps result in the identification of a number of locations along the DC offset voltage-versus-clock phase function shown in FIG. 2. The clock skew setting yielding the DC offset voltage in the data output of device 2A having the greatest magnitude is identified as the 180 degree clock skew. The 180 degree clock skew yields the largest magnitude DC offset in the data output due to the relationship between clock skew and the transfer of DC offset as illustrated in FIG. 2.

Next, the 180 degree clock skew is then shifted at 34 by approximately 180 degrees so as to set the clock skew between data source 5 and device 2A to be approximately zero degrees. The 180 degree clock skew is shifted by manipulating phase shift circuit 7. The procedure for shifting the clock skew varies based upon the characteristics of phase shift circuit 7. In the event phase shift circuit 7 is calibrated in terms of phase shift versus control voltage, a calibration table may be referred to in order to implement the 180 degree phase shift. Alternatively, in the event phase shift circuit 7 is linear but of unknown gain, the gain can be determined by finding two adjacent clock skew settings, such as 180 degrees and −180 degrees. The two adjacent clock skew settings may be obtained by using, for example, steps 31–33 described above for each adjacent clock skew setting. Because the two adjacent clock skew settings are approximately 360 degrees apart, the optimum clock skew setting (i.e., the clock skew setting resulting in input data to device 2A being interpreted without error) is the midpoint between the adjacent clock skew settings.

It is understood that the clock skew may be shifted in step 34 by an amount other than 180 degrees to obtain a desired clock skew amount other than a zero degree clock skew.

Figure 4:
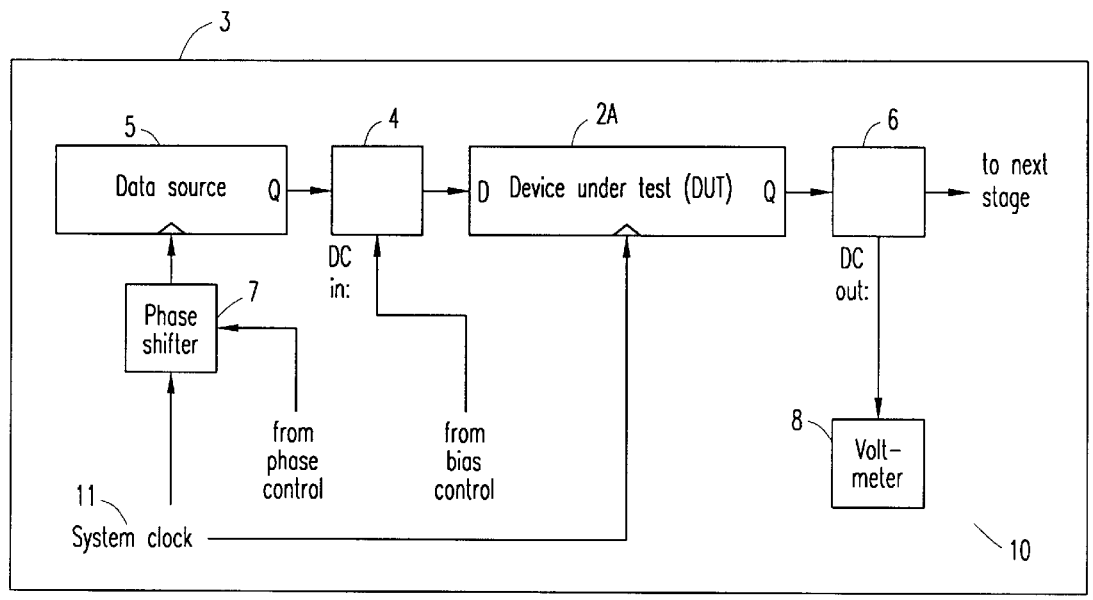
FIG. 4 is a block diagram of a portion of a communications system according to another exemplary embodiment of the present invention.

It is understood that since phase shift circuit 7 in FIG. 1 provides a clock skew between the clock input to device 2A and the clock input to data source 5 (i.e., the system clock 11), phase shift circuit 7 may be located elsewhere in circuit 1 while still allowing a clock skew between device 2A and data source 5. FIG. 4 illustrates a circuit 10 according to another exemplary embodiment of the present invention. The phase shift circuit 7 of circuit 10 is disposed between the system clock 11 and the clock input to data source 5. The system clock 11 is in this embodiment directly connected to the clock input of device 2A. Circuit 10 may be employed to set the clock skew between the clock input of device 2A and the clock input of data source 5 to the optimum value. The operation for setting the clock skew to the optimum value is substantially the same as the operation described above with respect to circuit 1 of FIG. 1.

Figure 5:
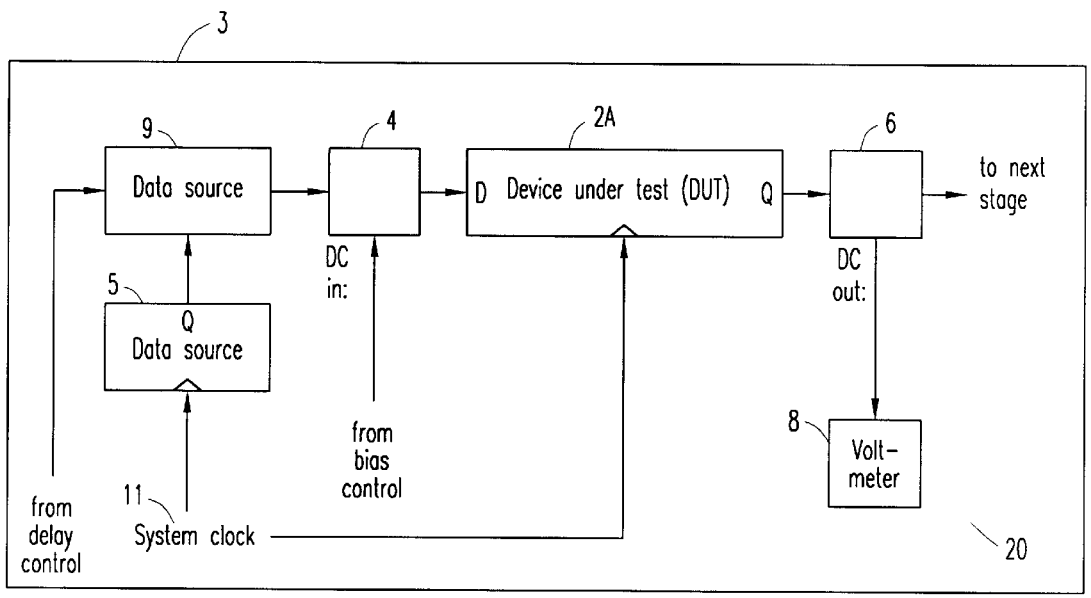
FIG. 5 is a block diagram of a portion of a communications system according to yet another exemplary embodiment of the present invention.

FIG. 5 illustrates a circuit 20 according to yet another exemplary embodiment of the present invention. Instead of using a phase shift circuit 7 to arrive at an optimum clock skew between the clock inputs of device 2A and data source 5, a variable delay circuit 9 is disposed between the data output of data source 5 and the data input of bias circuit 4. The system clock 11 is directly connected to the clock inputs of device 2A and data source 5. Variable delay circuit 9 may be controlled to vary the delay between the data input of variable delay circuit 9 and the data output thereof. By altering the delay of the data between data source 5 and device 2A, differences in clock delays between data source 5 and device 2A may be corrected and optimized. The clock delay is effectively optimized by following steps 31–34 above, with the understanding that variable delay circuit 9 is manipulated to adjust the effective clock skew setting to approximately 180 degrees and to shift the 180 degree clock skew setting by approximately 180 degrees thereafter.

Figure 6:
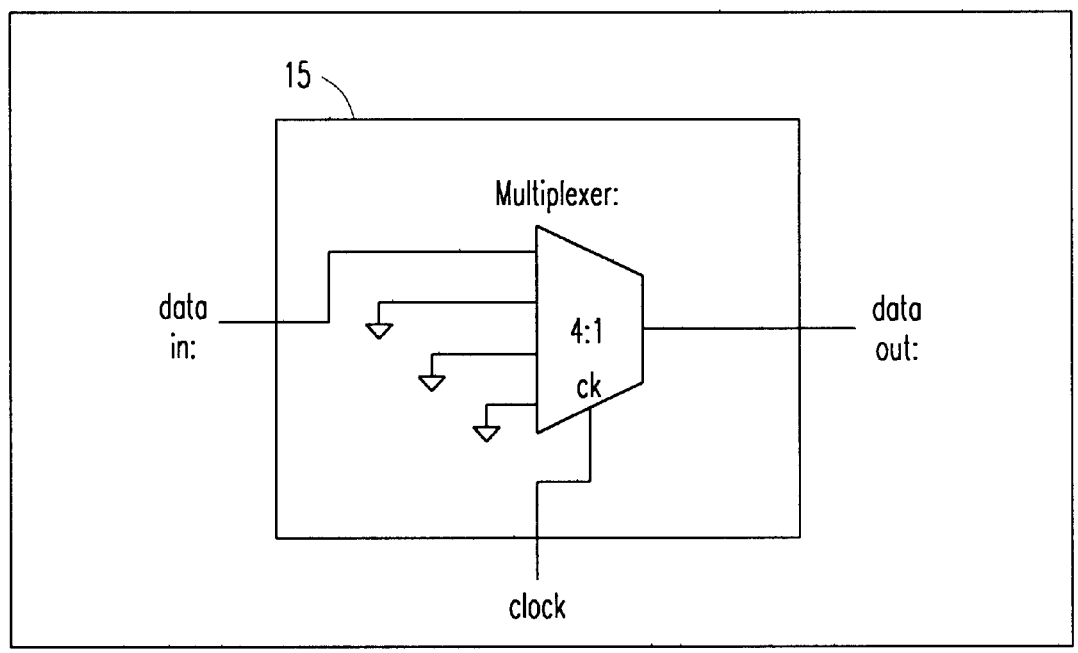
FIG. 6 is a diagram of a multiple-input device under test according to another exemplary embodiment of the present invention.

It is understood that embodiments of the present invention may be used to optimize the clock timing between multiple-input devices in a system. FIG. 6 illustrates a device under test 15 having a plurality of data inputs. In the event that the data inputs to device 15 have similar timing, the desired clock skew between the clock input to device 15 and the clock input to the data source may be obtained by setting all but one of the data inputs to device 15 to a static or constant logic level and applying a data pattern to one data input. In the event the data inputs to device 15 do not have similar timing, the timing of the various data sources providing data to device 15 may be adjusted to the desired or optimum setting.

In FIG. 6, device 15 is illustrated as a multiplexer circuit for exemplary purposes only. It is understood that device 15 may be virtually any clocked, multiple-input device.

Although various embodiments of the method, system, and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the scope of the invention as set forth and defined by the following claims.

I claim:

1. A method for setting clock skew for a device in a system, comprising:

adjusting to approximately 180 degrees a clock skew between a clock input to the device and a clock input to a data source providing data to the device, to obtain an 180 degree clock skew; and shifting by approximately 180 degrees the 180 degree clock skew.

2. The method of claim 1, wherein:

the step of adjusting comprises adjusting the clock skew between the device to two separate clock skew amounts, each clock skew amount providing an approximately maximum DC offset appearing at an output of the device; and the step of shifting comprises shifting the clock skew from one of the two separate clock skew amounts to a clock skew amount approximately at a midpoint between the two separate clock skew amounts.

3. The method of claim 1, wherein the step of adjusting comprises:

initially setting an offset of at least one data input of the device to a predetermined level;

setting the clock skew between the clock input to the device and the clock input to the data source to a predetermined skew amount;

applying a data pattern to the at least one data input of the device; and monitoring a data output of the device.

4. The method of claim 3, wherein the step of monitoring comprises:

monitoring a DC component of the data output of the device.

5. The method of claim 4, wherein the step of adjusting further comprises:

repeating the steps of setting the clock skew with a different clock skew amount, applying and monitoring a number of times; and identifying a maximum DC component of the data output of the device, the clock skew amount corresponding to the maximum DC component of the data output of the device comprising the 180 degree clock skew.

6. The method of claim 4, wherein the DC component monitored is a DC voltage of the data output of the device.

7. The method of claim 3, wherein the offset of the at least one data input of the device is a DC voltage offset.

8. The method of claim 3, wherein the step of adjusting further comprises:

setting inputs other than the at least one data input of the device to a static level.

9. The method of claim 1, wherein the step of adjusting comprises:

initially setting an offset of at least one data input of the device to a predetermined level; and determining a clock skew amount resulting in a maximum DC offset in a data output of the device, the clock skew amount comprising the 180 degree clock skew.

10. The method of claim 1, wherein the step of adjusting comprises:

adjusting the timing of the clock input to the device to have clock skew of approximately 180 degrees relative to the clock input to the data source.

11. The method of claim 1, wherein the step of adjusting comprises:

adjusting the timing of the clock input to the data source to have clock skew of approximately 180 degrees relative to the clock input to the device.

12. A circuit for setting a clock skew for a device in a system, comprising:

a first circuit for selectively adjusting a clock skew between a clock input to the device and a clock input to a data source providing data to a data input of the device;

a second circuit connected to a data input of the device for providing an offset of a predetermined amount to signals appearing at the data input of the device; and a third circuit coupled to a data output of the device for measuring an offset of the data output of the device.

13. The circuit of claim 12, wherein:

the second circuit comprises a bias circuit capable of providing a DC offset having any of a plurality of DC values to the data input of the device.

14. The circuit of claim 12, wherein:
the second circuit is connected between the data source and the device.

15. The circuit of claim 12, wherein the first circuit comprises:
a phase shift circuit having an output connected to the clock input to the device and capable of providing any of a number of clock skew values between the clock input to the device and the clock input to the data source.

16. The circuit of claim 12, wherein the first circuit comprises:
a phase shift circuit having an output connected to the clock input to the data source and capable of providing any of a number of clock skew values between the clock input to the device and the clock input to the data source, the clock input of the device and a clock input to the phase shift circuit being connected together.

17. The circuit of claim 12, wherein the third circuit comprises:
a signal splitter circuit having an input connected to the data output of the device and an output capable of providing a signal representative of a DC level of the data output of the device.

18. The circuit of claim 17, wherein the third circuit further comprises:
a measuring circuit having an input connected to the output of the signal splitter circuit and an output capable of providing an indication of the DC level appearing at the input of the measuring circuit.

19. The circuit of claim 18, wherein:
the indication of the DC level comprises a visual indication.

20. The circuit of claim 18, wherein:
the measuring circuit comprises a voltmeter.

21. A circuit for setting a clock skew for a device in a system, comprising:
a first circuit for selectively adjusting a delay between a first input to the device and a first output of a data source providing data to the device;
a second circuit connected between the first circuit and the device for setting an offset of the first input of the device; and
a third circuit connected to a data output of the device for measuring an offset of the data output.

22. The circuit of claim 21, wherein:
the first circuit comprises a delay circuit having a first input connected to a data output of the data source and an output coupled to the first input of the device and capable of providing any of a plurality of delays between a signal appearing at the input of the delay circuit and a signal appearing at the output thereof.

23. The circuit of claim 21, wherein:
the first input of the device is a data input; and
the first output of the data source is a data output.

24. The circuit of claim 23, wherein a clock input of the device is connected to a clock input of the data source.

25. The circuit of claim 21, wherein:
the second circuit comprises a circuit capable of providing a DC offset to the first input of the device having any of a plurality of DC values.

26. The circuit of claim 21, wherein the third circuit comprises:
a signal splitter circuit having an input connected to a data output of the device and an output capable of providing a signal representative of a DC level of the data output of the device.

27. The circuit of claim 26, wherein the third circuit further comprises:
a measuring circuit having an input connected to the output of the signal splitter circuit and an output capable of providing an indication of the DC level appearing at the input of the metering circuit.

28. The circuit of claim 27, wherein the measuring circuit comprises a voltmeter.

29. A method for setting clock skew for a device in a communications system, comprising:
adjusting a clock skew between the device and a system clock to provide an approximately maximum DC offset appearing at an output of the device; and
shifting the clock skew from the adjusted clock skew by a predetermined amount to obtain a desired clock skew.

30. The method of claim 29, wherein the predetermined amount is approximately 180 degrees.

31. The method of claim 29, further comprising:
initially setting a DC offset of a data input to the device to a predetermined level.

32. The method of claim 31, wherein the step of adjusting comprises:
setting the clock skew between the clock input of the device and the system clock to a predetermined amount;
applying a data pattern to a data input of the device;
measuring the DC offset appearing at the output of the device;
repeating the steps of setting, applying and measuring a number of times, with each setting step applying a distinct clock skew amount between the clock input of the device and the system clock; and
identifying the clock skew amount providing the largest magnitude DC offset appearing at the output of the device and setting the clock skew to the identified clock skew amount.

33. The method of claim 29, wherein:
the step of adjusting comprises adjusting a clock skew between the device and the system clock to two clock skew amounts, each clock skew amount providing an approximately maximum DC offset appearing at an output of the device; and
the step of shifting comprises shifting the clock skew between the device and the system clock to a phase amount approximately at a midpoint between the two clock skew amounts.

34. The method of claim 29, wherein the step of adjusting comprises:
adjusting a delay to a data input of the device.

35. A method for setting clock skew for a device in a system, comprising:
applying an offset to a data input of the device;
adjusting a timing value between the device and a data source providing data to the device, to provide an approximately maximum DC offset appearing at an output of the device; and
shifting the timing value by a predetermined amount to obtain a desired clock skew.

36. The method of claim 35, wherein the timing value is a timing value between a data output of the data source and a data input of the device.

37. The method of claim 35, wherein the timing value is a timing value between a clock input to the data source and a clock input to the device.

38. A method of achieving a desired relative phase between a data sending device and a data receiving device, comprising:

imposing a DC offset at an input of said data receiving device;

measuring a DC offset at an output of said data receiving device while varying the relative phase between said data sending device and said data receiving device so as to locate one or more features in a voltage-versus-phase function, each of said features corresponding to a known relative phase between said data sending device and said data receiving device; and adjusting said phase relative to said one or more features to attain said desired relative phase.

39. The method of claim 38, wherein a phase from which said relative phase is adjusted is a phase corresponding to a substantially maximum voltage in said voltage-versus-phase function.

40. The method of claim 38, wherein said relative phase between said data sending device and said data receiving device is varied by varying a phase delay of a clock signal applied to said data sending device.

41. The method of claim 38, wherein said relative phase between said data sending device and said data receiving device is varied by varying a phase delay of a clock signal applied to said data receiving device.

42. The method of claim 38, wherein said relative phase between said data sending device and said data receiving device is varied by varying a delay of a data signal generated by said data sending device and received by said data receiving device.

43. The method of claim 38, wherein said desired relative phase is an approximately zero degree phase.

* * * * *